(12) United States Patent
Hayasaka

(10) Patent No.: US 10,838,033 B2
(45) Date of Patent: Nov. 17, 2020

(54) TESTER CALIBRATION DEVICE AND TESTER CALIBRATION METHOD

(71) Applicant: TOSHIBA MEMORY CORPORATION, Minato-ku (JP)

(72) Inventor: Kazuhito Hayasaka, Minato (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 219 days.

(21) Appl. No.: 16/026,495

(22) Filed: Jul. 3, 2018

(65) Prior Publication Data
US 2019/0285715 A1 Sep. 19, 2019

(30) Foreign Application Priority Data
Mar. 19, 2018 (JP) ................. 2018-050594

(51) Int. Cl.
*G01R 31/00* (2006.01)
*G01R 35/00* (2006.01)
*H01R 12/71* (2011.01)
*H01R 12/70* (2011.01)
*G01R 3/00* (2006.01)
*G01R 31/28* (2006.01)
*G01R 1/04* (2006.01)
*H01R 13/22* (2006.01)
*H03K 5/24* (2006.01)

(52) U.S. Cl.
CPC ......... *G01R 35/005* (2013.01); *G01R 1/0466* (2013.01); *G01R 3/00* (2013.01); *G01R 31/2886* (2013.01); *H01R 12/7082* (2013.01); *H01R 12/716* (2013.01); *H01R 13/22* (2013.01); *H03K 5/24* (2013.01)

(58) Field of Classification Search
CPC .............. G01R 35/005; G01R 31/2886; G01R 31/2834; G01R 31/3191; G01R 31/31905; G01R 31/31922; G01R 31/31924; G01R 31/31937; G01R 1/0466; G01R 1/07378; G01R 1/0411; G01R 1/24
See application file for complete search history.

(56) References Cited

U.S. PATENT DOCUMENTS

| | | | | |
|---|---|---|---|---|
| 6,417,682 B1* | 7/2002 | Suzuki | ............... | G01R 31/3191 324/537 |
| 6,794,861 B2* | 9/2004 | Maassen | ............... | G01R 35/005 324/750.02 |
| 7,121,132 B2* | 10/2006 | Ibane | ................. | G01R 31/3191 73/1.42 |

(Continued)

FOREIGN PATENT DOCUMENTS

| JP | 61-17671 U | 2/1986 |
|---|---|---|
| JP | 5-335733 | 12/1993 |
| JP | 2007-155619 | 6/2007 |

*Primary Examiner* — Thang X Le
(74) *Attorney, Agent, or Firm* — Oblon, McClelland, Maier & Neustadt, L.L.P.

(57) ABSTRACT

In one embodiment, a tester calibration device includes a first board to be installed on one of a plurality of sockets of a tester for testing a semiconductor device, when the tester is to be calibrated. The device further includes a plurality of first pins provided on a first face of the first board, and to be made contact with the one socket when the tester is to be calibrated. The device further includes a wiring configured to electrically connect some of the plurality of first pins with each other.

18 Claims, 7 Drawing Sheets

(56) References Cited

U.S. PATENT DOCUMENTS

| | | | |
|---|---|---|---|
| 7,414,421 B2* | 8/2008 | Flach | G01R 35/005 324/750.02 |
| 2002/0135357 A1* | 9/2002 | Maassen | G01R 35/005 324/750.02 |
| 2009/0128172 A1* | 5/2009 | Takaki | G01R 35/005 324/756.07 |
| 2018/0003736 A1* | 1/2018 | Lee | G01R 1/24 |

\* cited by examiner

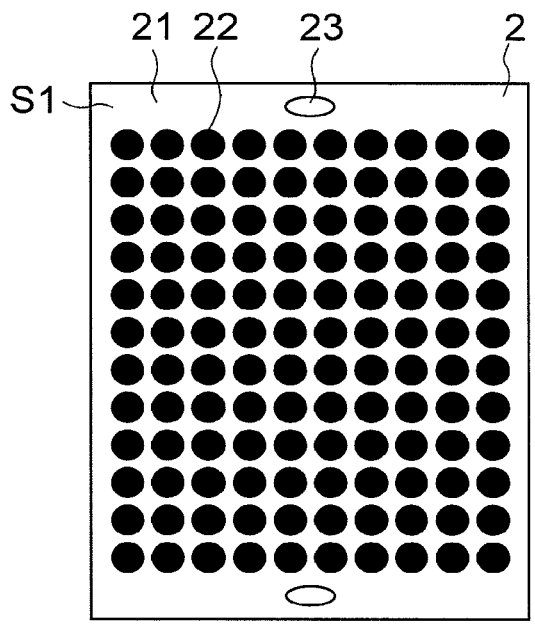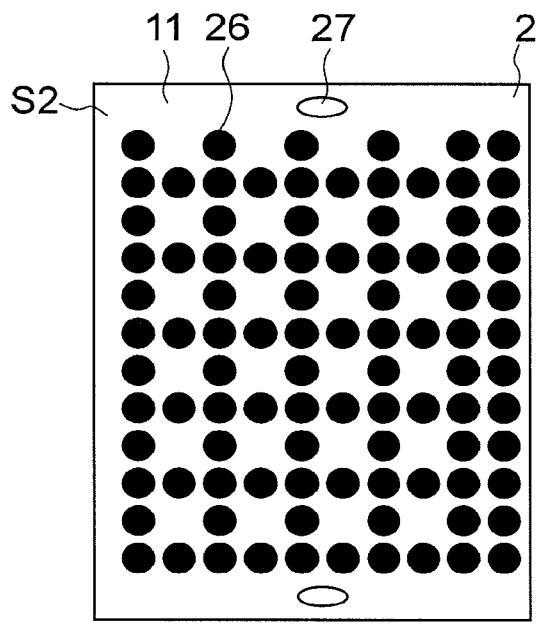
FIG. 7A          FIG. 7B
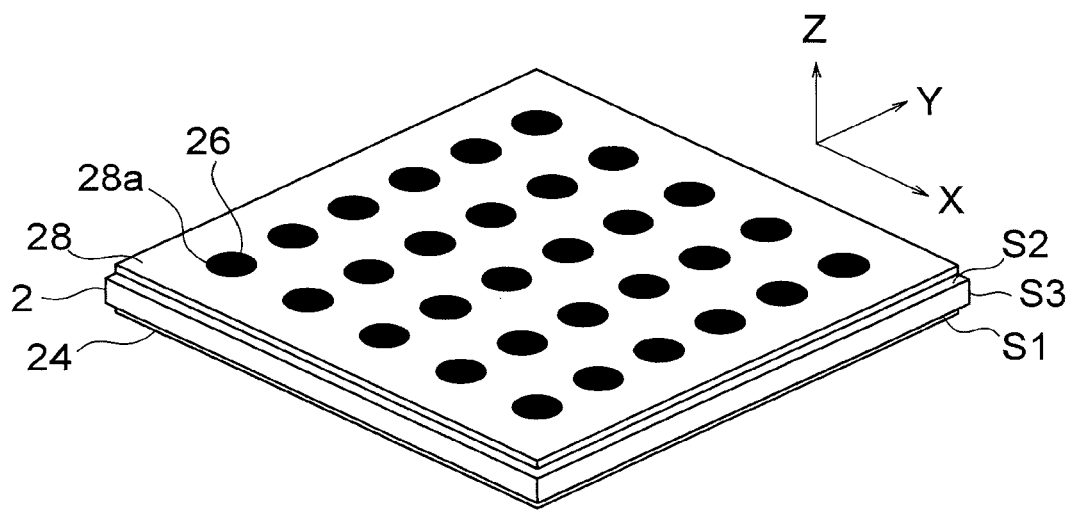
FIG. 7C

TESTER CALIBRATION DEVICE AND TESTER CALIBRATION METHOD

CROSS REFERENCE TO RELATED APPLICATION

This application is based upon and claims the benefit of priority from the prior Japanese Patent Application No. 2018-050594, filed on Mar. 19, 2018, the entire contents of which are incorporated herein by reference.

FIELD

Embodiments described herein relate to a tester calibration device and a tester calibration method.

BACKGROUND

When a tester (testing device) for testing a semiconductor device is calibrated, it is cumbersome to manually make a probe contact with a socket of the tester for the calibration. To avoid this probe contact, a calibration device is used to calibrate the tester. However, there is a problem what kind of the calibration device is to be used to effectively calibrate the tester.

BRIEF DESCRIPTION OF THE DRAWINGS

FIGS. 7A to 7C are top views and a perspective view illustrating the structure of a tester calibration device of a second embodiment.

DETAILED DESCRIPTION

Embodiments will now be explained with reference to the accompanying drawings. Any identical or similar components in FIGS. 1 to 8C are denoted by an identical reference sign, and duplicate description thereof will be omitted.

In one embodiment, a tester calibration device includes a first board to be installed on one of a plurality of sockets of a tester for testing a semiconductor device, when the tester is to be calibrated. The device further includes a plurality of first pins provided on a first face of the first board, and to be made contact with the one socket when the tester is to be calibrated. The device further includes a wiring configured to electrically connect some of the plurality of first pins with each other.

First Embodiment

Figure 1:
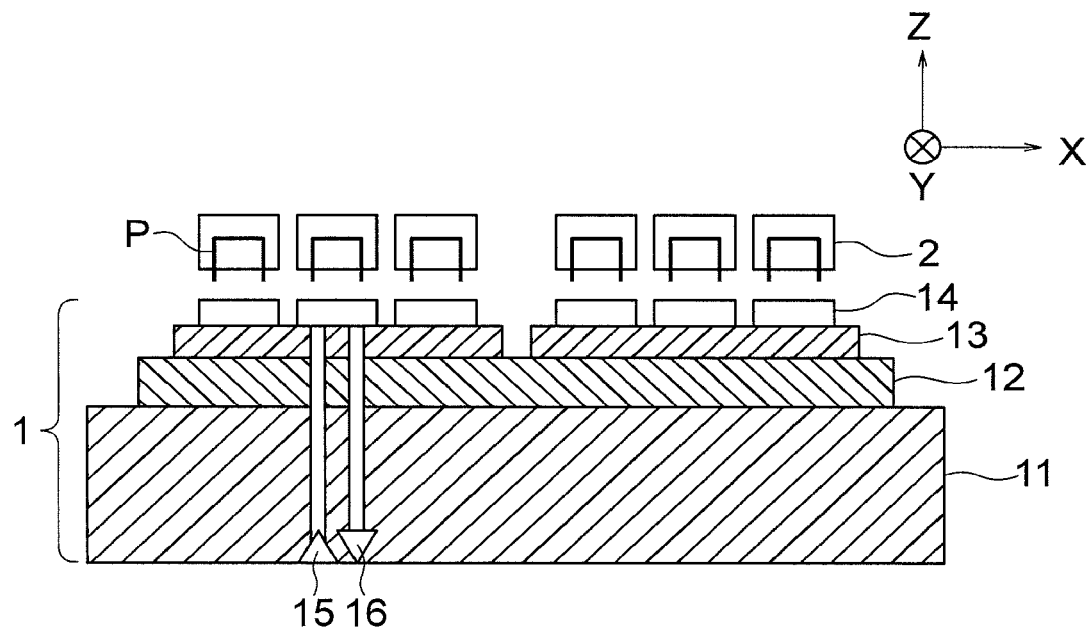
FIG. 1 is a cross-sectional view illustrating the structures of a tester and tester calibration devices of a first embodiment.

FIG. 1 is a cross-sectional view illustrating the structures of a tester 1 and tester calibration devices 2 of a first embodiment.

The tester 1 of the present embodiment includes a motherboard 11, a performance board 12, a plurality of DUT (device under test) boards 13, a plurality of sockets 14, a plurality of tester drivers 15, and a plurality of tester comparators 16. For convenience of description, FIG. 1 exemplarily illustrates one of the plurality of tester drivers 15 and one of the plurality of tester comparators 16.

The sockets 14 are used to hold a semiconductor device to be tested. Examples of such a semiconductor device include a semiconductor memory, a logic integrated circuit (IC), and a discrete device. Each socket 14 includes a plurality of contacts provided for electrical connection with the semiconductor device, and a plurality of terminals electrically connected with the corresponding DUT board 13. The number of contacts of each socket 14 is, for example, several tens to several hundreds. Each socket 14 is fixed to the corresponding DUT board 13 by, for example, a screw or solder. Each DUT board 13 is electrically connected with the motherboard 11 through the performance board 12.

The tester drivers 15 and the tester comparators 16 are provided in the motherboard 11. The tester drivers 15 transmit signals to the semiconductor device on the sockets 14. The tester comparators 16 receive signals from the semiconductor device on the sockets 14. The tester 1 of the present embodiment tests operation of the semiconductor device by using the tester drivers 15 and the tester comparators 16.

FIG. 1 illustrates X and Y directions parallel to an upper surface of the motherboard 11 and orthogonal to each other, and a Z direction orthogonal to the upper surface of the motherboard 11. In the present specification, an upward direction is defined to be in the positive Z direction, and a downward direction is defined to be in the negative Z direction. However, the negative Z direction may be or not aligned with the direction of gravitational force.

FIG. 1 also illustrates a plurality of tester calibration devices 2 installable on the plurality of sockets 14 of the tester 1. Examples of the tester calibration devices 2 include a calibration board for the tester 1. Each tester calibration device 2 of the present embodiment is provided as an individual separated piece for the corresponding socket 14 so that the tester calibration devices 2 are installed on the respective sockets 14. FIG. 1 illustrates a situation in which K tester calibration devices 2 are installed on K (K is an integer equal to or larger than one) sockets 14 of the tester 1 to calibrate the tester 1.

In the calibration of the tester 1, the tester 1 adjusts operation of the tester drivers 15 and the tester comparators 16 by using the tester calibration devices 2. Specifically, the tester drivers 15 transmit signals to the tester calibration devices 2 on the sockets 14, and the tester comparators 16 receive signals from the tester calibration devices 2 on the sockets 14. Then, the tester 1 adjusts the tester drivers 15 and the tester comparators 16 based on these signals.

Each tester calibration device 2 has a function to short-circuit a contact and another contact in each socket 14. Reference sign P in FIG. 1 schematically indicates this function of each tester calibration device 2. Each tester calibration device 2 short-circuits, for example, a contact to be connected with an input terminal of the semiconductor device, and a contact to be connected with an output terminal of the semiconductor device. Accordingly, the tester 1 is calibrated so that the tester 1 can appropriately test a relation between an input signal to the input terminal and an output signal from the output terminal.

According to the present embodiment, the tester 1 calibrates the own device by using the tester calibration devices 2 so that the calibration is performed without manually making a probe contact with each socket 14 of the tester 1.

Figure 2:
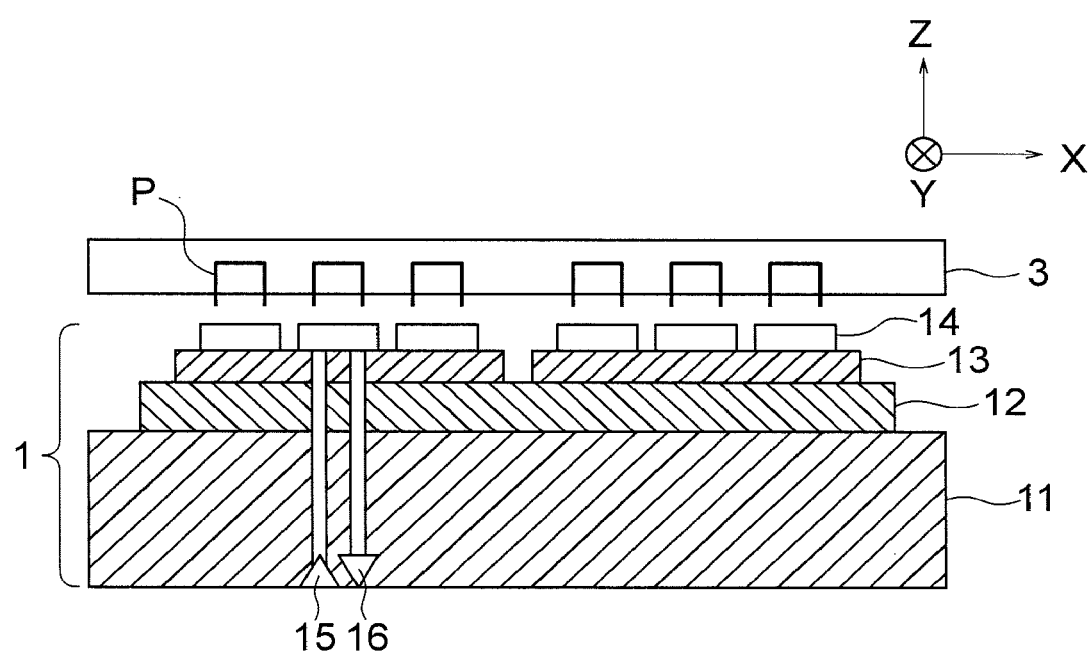
FIG. 2 is a cross-sectional view illustrating the structures of a tester and a tester calibration device of a comparative example of the first embodiment.

FIG. 2 is a cross-sectional view illustrating the structures of the tester 1 and a tester calibration device 3 of a comparative example of the first embodiment.

Each tester calibration device 2 in FIG. 1 is provided as an individual separated piece for the corresponding socket 14 so that the tester calibration devices 2 are installed on the respective sockets 14. However, the tester calibration device 3 in FIG. 2 is common to all sockets 14 so that the single tester calibration device 3 is installed on the plurality of sockets 14.

In the present comparative example, since the single tester calibration device 3 is installed on the plurality of sockets 14, some of the sockets 14 do not sufficiently contact with the tester calibration device 3 in some cases. In such a case, the tester 1 potentially needs to be calibrated again, which is waste.

However, in the present embodiment, since each tester calibration device 2 is installed on the corresponding socket 14, the sockets 14 are sufficiently made contact with the respective tester calibration devices 2. Accordingly, the calibration of the tester 1 can be accurately and efficiently performed.

Moreover, in the present comparative example, when pin assignment of a semiconductor device to be tested is changed, the tester calibration device 3 needs to be manufactured again. This causes problems such as waste of a manufacturing cost and a manufacturing duration of the tester calibration device 3.

However, in the present embodiment, when pin assignment of a semiconductor device to be tested is changed, a mask board of each tester calibration device 2 is changed as described later to handle the pin assignment change. Accordingly, the tester 1 can be calibrated at low cost in a short time.

Each tester calibration device 2 illustrated in FIG. 1 will be described below in detail with reference to FIGS. 3A to 6D.

FIGS. 3A to 4B are cross-sectional views and top views of the structure of a tester calibration device 2 of the first embodiment.

Figure 3A:
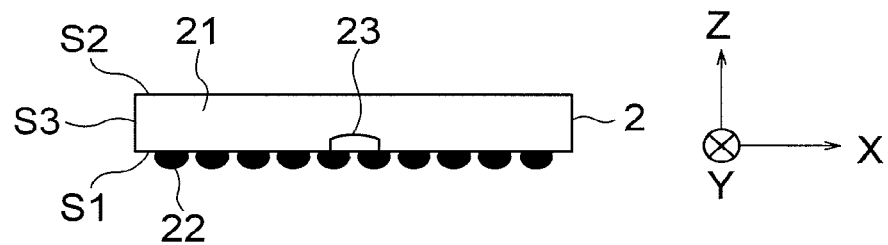
FIGS. 3A to 6D are cross-sectional views and top views illustrating the structure of a tester calibration device of the first embodiment.
Figure 3B:
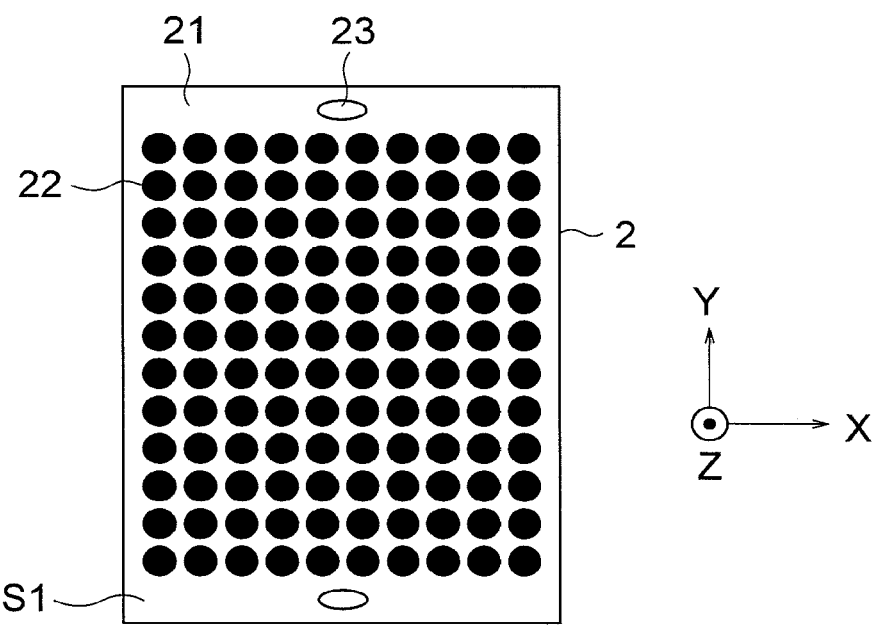

As illustrated in FIGS. 3A and 3B, the tester calibration device (calibration board) 2 of the present embodiment includes a base board 21 as an example of a first board, a plurality of pins 22 as an example of first pins, and a plurality of gel pits 23. For convenience of description, the base board 21 in the top view of FIG. 3B is vertically inverted with respect to the base board 21 in the cross-sectional view of FIG. 3A (this is the same for any drawings described below).

The base board 21 has a first face S1, a second face S2 opposite to the first face S1, and four end faces S3 between the first face S1 and the second face S2. The plurality of pins 22 and the plurality of gel pits 23 are provided on the first face S1 of the base board 21. The base board 21 of the present embodiment has dimensions substantially same as those of a semiconductor device to be tested. The pins 22 of the present embodiment are formed of conductive material.

When the tester 1 is calibrated, the base board 21 is installed on one of the plurality of sockets 14 of the tester 1 with the first face S1 facing downward. Accordingly, the pins 22 provided to the base board 21 are made contact with the socket 14. Specifically, some of the pins 22 provided to the base board 21 contact with the corresponding contacts in the socket 14 as described later.

Figure 3C:
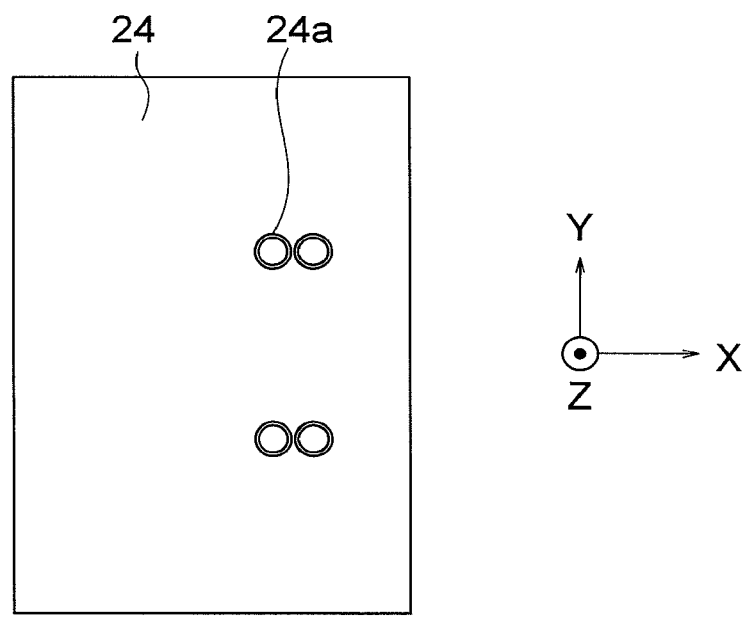

FIG. 3C illustrates a mask board 24 including four openings 24a. The mask board 24 is an example of a second board. The openings 24a are an example of N (N is an integer equal to or larger than one) first openings. The mask board 24 of the present embodiment is formed of insulating material.

Figure 4A:
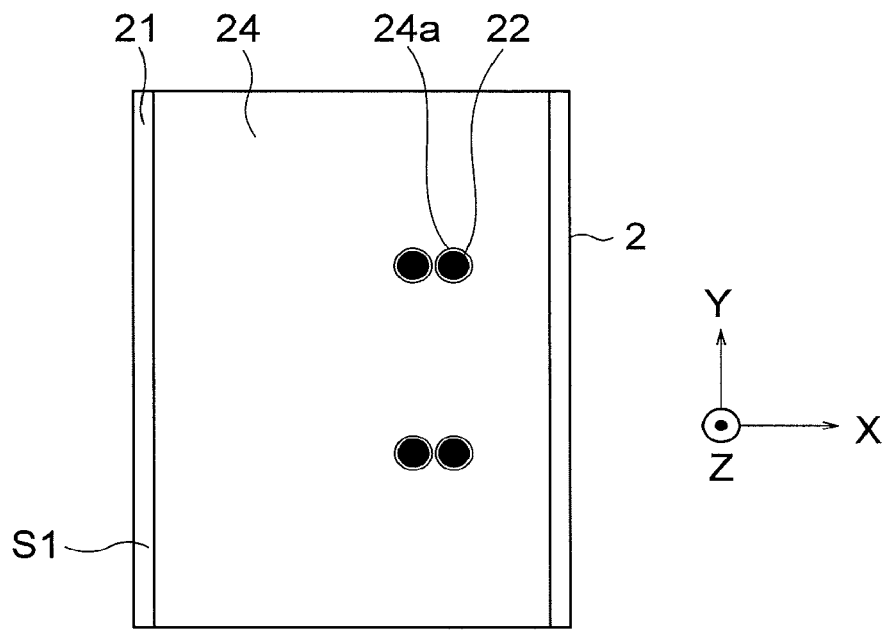
Figure 4B:
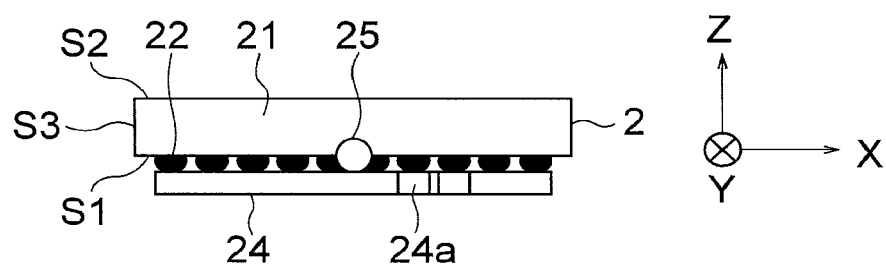

As illustrated in FIGS. 4A and 4B, the mask board 24 is attachable to the first face S1 of the base board 21 through the plurality of pins 22. Specifically, adhesive gel 25 for fixing the base board 21 and the mask board 24 is applied in the gel pits 23 and sandwiched between the base board 21 and the mask board 24 so that the mask board 24 is attached to the base board 21. In the present embodiment, the mask board 24 may be detached from the base board 21 after mounted on the base board 21. The mask board 24 may be mounted on the first face S1 of the base board 21 by any means other than the gel 25.

When the mask board 24 is mounted on the base board 21, four of the plurality of pins 22 are exposed through the openings 24a. The other pins 22 are covered by the mask board 24.

When the tester 1 is calibrated, the base board 21 is installed on the corresponding socket 14 while the mask board 24 is mounted on the first face S1. Accordingly, the four pins contact with the socket 14, and hence with the corresponding contacts in the socket 14, through the four openings 24a (hereinafter, the four pins 22 are referred to as contact pins 22). The other pins 22, which are covered by the mask board 24, do not contact with contacts in the socket 14 (hereinafter, the other pins 22 are referred to as non-contact pins 22). However, the non-contact pins 22 can be electrically connected with contacts through the contact pins 22 as described later.

Figure 5A:
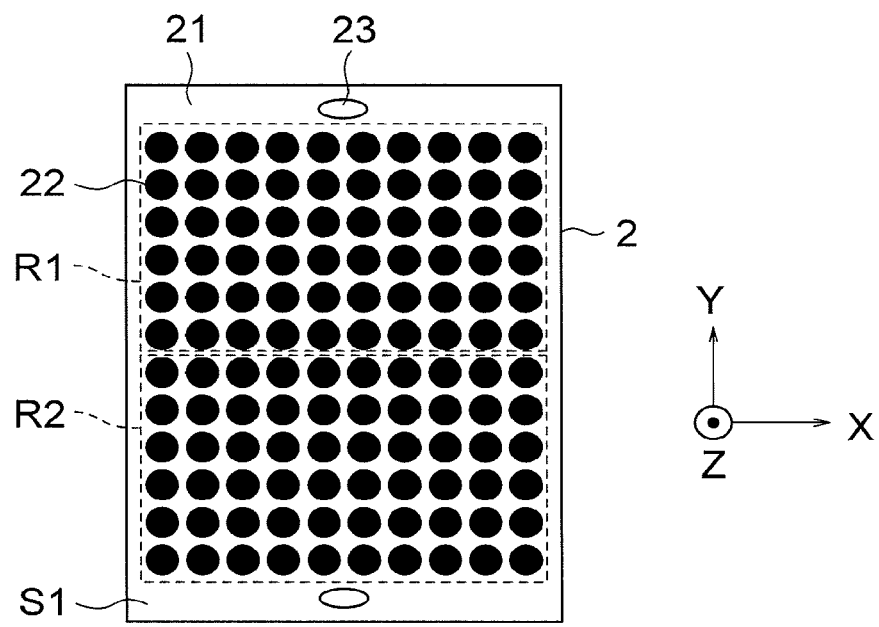
Figure 5B:
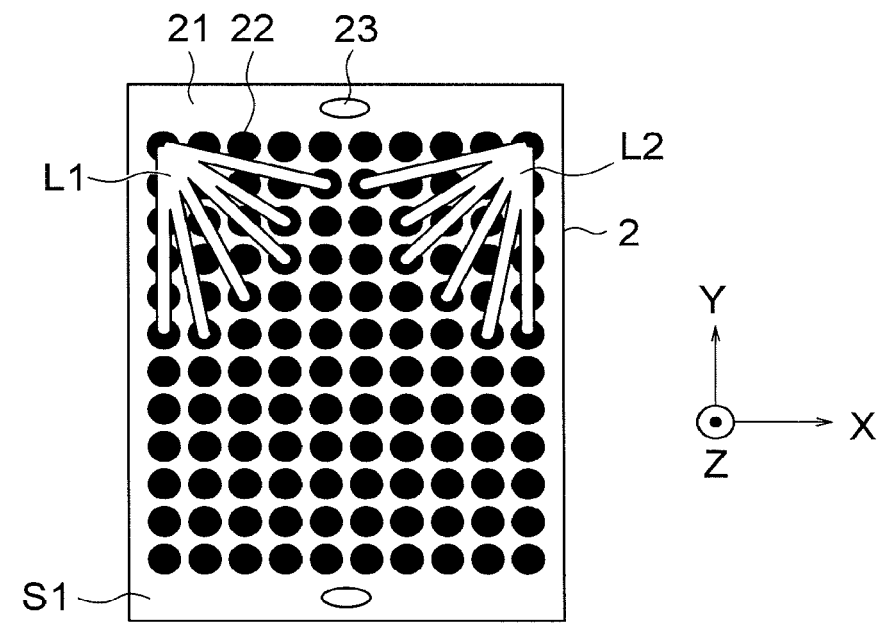
Figure 6A:
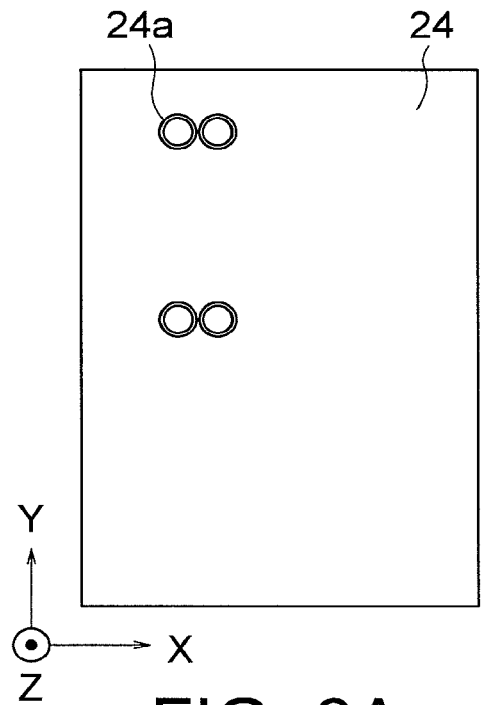
Figure 6B:
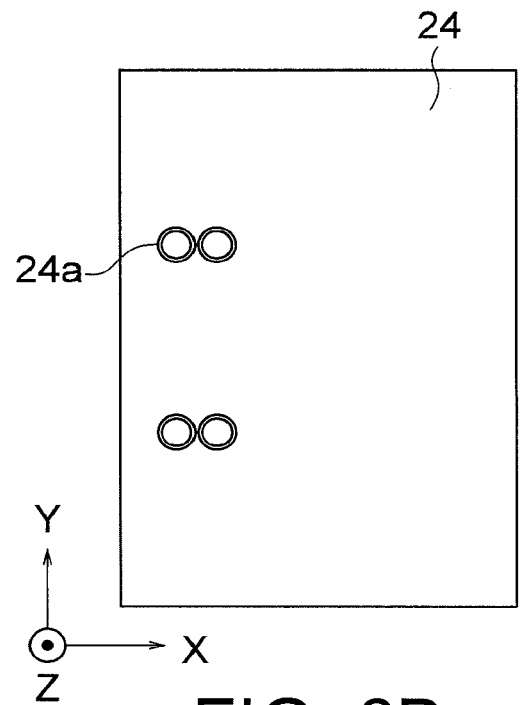
Figure 6C:
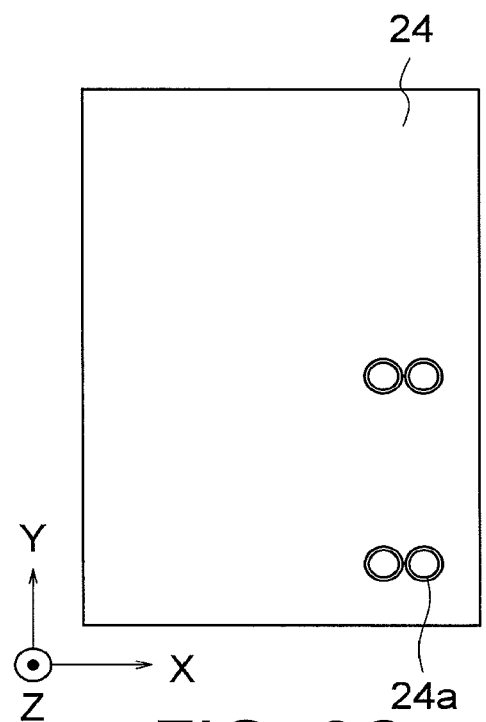
Figure 6D:
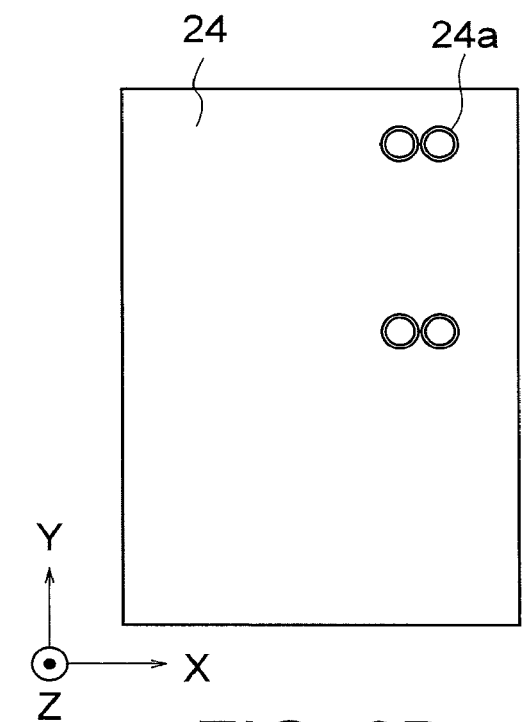

FIGS. 5A and 5B are other top views illustrating the structure of the tester calibration device 2 of the first embodiment.

In the present embodiment, all pins 22 on the first face S1 except for power supply pins such as VCC and VSS pins are electrically connected with each other through wirings in each group. Such wirings are provided, for example, in the base board 21. For example, the electrical connection is made between an input pin corresponding to the input terminal of the semiconductor device and an output pin corresponding to the output terminal of the semiconductor device. The shape of wirings may be any shape, and is, for example, a linear or planar shape.

FIG. 5A illustrates exemplary groups in each of which the pins 22 are electrically connected with each other. In FIG. 5A, the pins 22 (except for any power supply pin) in a first group positioned in Region R1 are electrically connected with each other, and the pins 22 (except for any power supply pin) in a second group positioned in Region R2 are electrically connected with each other. In this case, the pins 22 in the first group may be electrically connected with each other through wirings in a planar shape same as that of Region R1. Similarly, the pins 22 in the second group may be electrically connected with each other through wirings in a planar shape same as that of Region R2.

In FIG. 5A, the two openings 24a are disposed at positions over the two pins 22 in Region R1. The tester 1 transmits a signal from the corresponding tester driver 15 to one of the pins 22 through one of the openings 24a, and the corresponding tester comparator 16 receives a signal from the other pin 22 through the other opening 24a. Accordingly, the tester 1 adjusts operation of these tester driver 15 and tester comparator 16. In FIG. 5A, the two openings 24a are disposed at positions over the two pins 22 in Region R2, and used in a manner same as that for the pins 22 and the openings 24a in Region R1.

FIG. 5B illustrates other exemplary groups in each of which the pins 22 are electrically connected with each other. In FIG. 5B, the pins 22 in a first group are electrically connected with each other through wirings L1, and the pins 22 in a second group are electrically connected with each other through wirings L2.

In FIG. 5B, the two openings 24a are disposed at positions over the two pins 22 in the first group. The tester 1 transmits a signal from the corresponding tester driver 15 to one of the pins 22 through one of the openings 24a, and the corresponding tester comparator 16 receives a signal from the other pin 22 through the other opening 24a. Accordingly, the tester 1 adjusts operation of these tester driver 15 and tester comparator 16. In FIG. 5B, the two openings 24a are disposed at positions over the two pins 22 in the second group, and used in a manner same as that for the pins 22 and the openings 24a in the first group.

In FIGS. 5A and 5B, the pins 22 on the first face S1 are exemplarily divided into two groups but may be divided into three groups or more. In this case, six openings 24a or more are provided to the mask board 24.

FIGS. 6A to 6D are other top views illustrating the structure of the tester calibration device 2 of the first embodiment.

FIGS. 6A to 6D illustrate various examples of the mask board 24. In the present embodiment, a plurality of mask boards 24 including the openings 24a at different positions may be prepared as illustrated in these examples. With this preparation, for example, when pin assignment of a semiconductor device to be tested is changed, only the mask board 24 is changed to handle the pin assignment change without changing the configurations of the base board 21 and the pins 22. Accordingly, the tester 1 can be calibrated at low cost in a short time.

As described above, each tester calibration device 2 of the present embodiment includes the base board 21 provided as an individual separated piece for the corresponding socket 14 of the tester 1, and the plurality of pins 22 provided on the first face S1 of the base board 21 and made contact with the corresponding one socket 14 when the tester 1 is calibrated. The mask board 24 including N (for example, four) openings 24a through which N pins 22 are to be exposed is attachable to the first face S1 of the base board 21 of the present embodiment so that the N pins 22 contact with contacts in the socket 14 through the N openings 24a.

According to the present embodiment, the calibration of the tester 1 can be effectively performed through, for example, accurate and efficient execution at low cost in a short time.

Second Embodiment

FIGS. 7A to 7C are top views and a perspective view of the structure of a tester calibration device 2 of a second embodiment.

The tester calibration device 2 of the present embodiment includes a plurality of pins 26 as an example of second pins, and a plurality of gel pits 27 in addition to components illustrated in FIGS. 3A and 3B. FIG. 7A is a top view illustrating the first face S1 of the base board 21, FIG. 7B is a top view illustrating the second face S2 of the base board 21, and FIG. 7C is a perspective view illustrating the base board 21 and other components. The base board 21 in the top view of FIG. 7B is vertically inverted with respect to the base board 21 in the cross-sectional view of FIG. 7A.

The configurations and usage of the pins 26 and the gel pits 27 are substantially same as the configurations and usage of the pins 22 and the gel pits 23, respectively. However, the pins 26 and the gel pits 27 are provided on the second face S2, not on the first face S1. Comparison between FIGS. 7A and 7B indicates that the number and disposition of the pins 26 on the second face S2 are different from the number and disposition of the pins 22 on the first face S1.

Since the tester calibration device 2 of the present embodiment is provided with the pins 22 and the pins 26 on the first face S1 and the second face S2, respectively, test calibration of two kinds of semiconductor devices can be performed by the single tester calibration device 2. When test calibration for one of the kinds of semiconductor devices is to be performed, the base board 21 is placed with the first face S1 facing downward, and the pins 22 on the first face S1 are made contact with the corresponding socket 14. When test calibration for the other kind of semiconductor devices is to be performed, the base board 21 is placed with the second face S2 facing downward, and the pins 22 on the second face S2 are made contact with the corresponding socket 14.

FIG. 7C illustrates a mask board 28 including 30 openings 28a. The mask board 28 is an example of a third board. The openings 28a are an example of M (M is an integer equal to or larger than one) second openings. The configuration and usage of the mask board 28 are substantially same as the configuration and usage of the mask board 24.

As illustrated in FIG. 7C, the mask board 28 is attachable to the second face S2 of the base board 21 through the pins 26. Specifically, adhesive gel for fixing the base board 21 and the mask board 28 is applied in the gel pits 27 and sandwiched between the base board 21 and the mask board 28 so that the mask board 28 is attached to the base board 21. In the present embodiment, the mask board 28 may be detached from the base board 21 after mounted on the base board 21. The mask board 28 may be mounted on the second face S2 of the base board 21 by any means other than the gel.

When the mask board 28 is mounted on the base board 21, 30 of the pins 26 are exposed through the openings 28a. The other pins 26 are covered by the mask board 28.

When the tester 1 is calibrated by using the pins 26 on the second face S2, the base board 21 is installed on the corresponding socket 14 while the mask board 28 is mounted on the second face S2. Accordingly, the 30 pins 26 contact with the socket 14, and hence with the corresponding contacts in the socket 14, through the 30 openings 28a (hereinafter, the 30 pins 26 are referred to as contact pins 26). The other pins 26, which are covered by the mask board 28, are, do not contact with contacts in the socket 14 (hereinafter, the other pins 26 are referred to as non-contact pins 26). However, the non-contact pins 26 can be electrically connected with contacts through the contact pins 26 as described in the first embodiment.

The above description with reference to FIGS. 5A to 6D also applies to the pins 26 and the mask board 28 on the second face S2. Specifically, the pins 26 may be electrically connected with each other through wirings, and a plurality of mask boards 28 including the openings 28a at different positions may be prepared.

According to the present embodiment, the tester 1 can be more effectively calibrated by effectively using both of the first face S1 and the second face S2 of the base board 21.

Third Embodiment

Figure 8A:
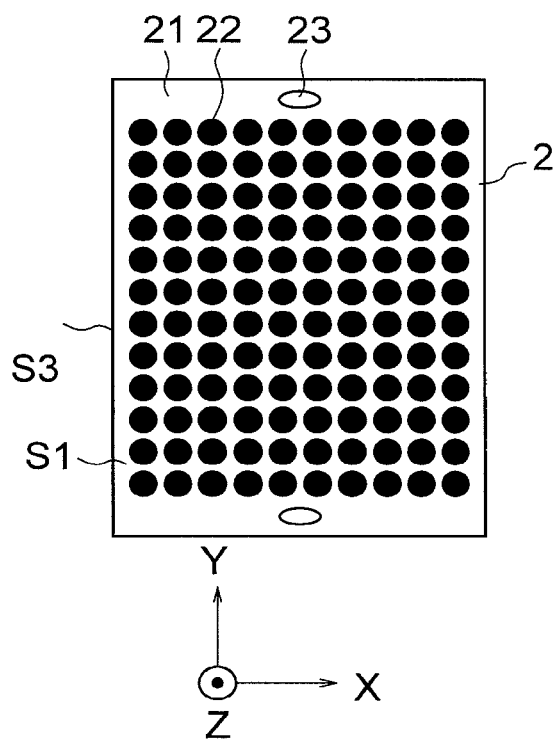
FIGS. 8A to 8C are top views illustrating the structure of a tester calibration device of a third embodiment.
Figure 8B:
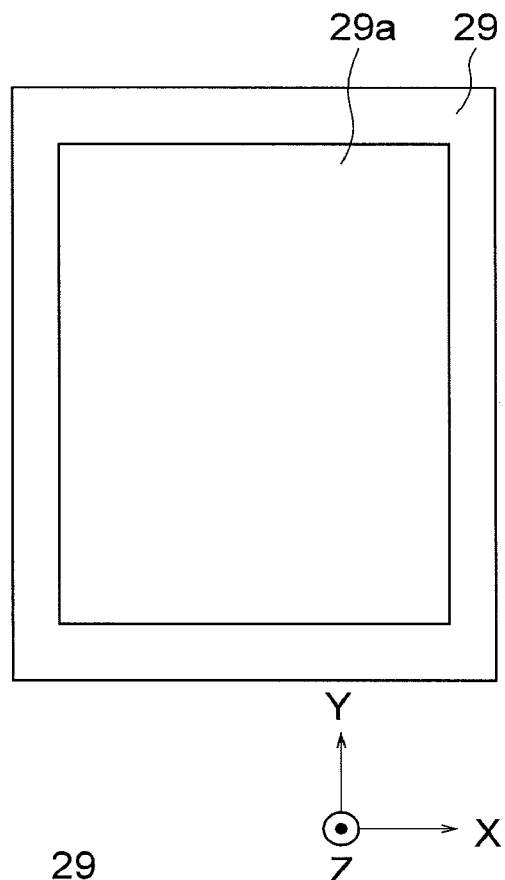
Figure 8C:
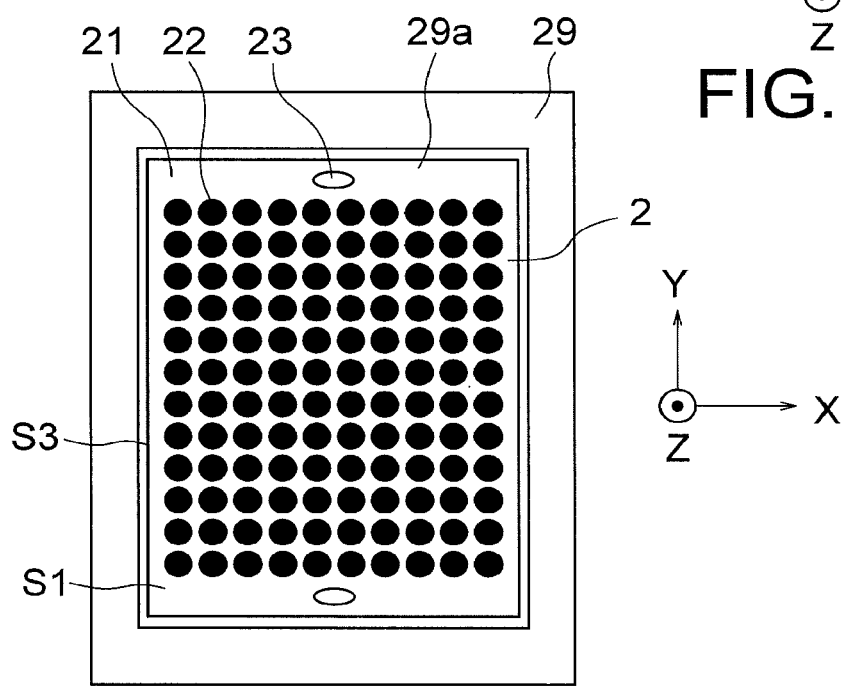

FIGS. 8A to 8C are top views illustrating the structure of a tester calibration device 2 of a third embodiment.

FIG. 8A illustrates the base board 21 same as that illustrated in FIG. 3A. An adapter 29 enclosing, in a ring shape, the four end faces S3 of the base board 21 is attachable to the base board 21 of the present embodiment as illustrated in FIG. 8C. The adapter 29 is a ring member including an opening 29a in which the base board 21 is housed as illustrated in FIG. 8B. The adapter 29 is an example of an outer frame.

The adapter 29 may be mounted on the base board 21 by any means. For example, the base board 21 and the opening 29a may be set to have substantially same sizes so that the base board 21 is fixed to the adapter 29 due to frictional force between the base board 21 and the adapter 29 when the base board 21 is inserted in the opening 29a.

According to the present embodiment, the tester calibration devices 2 can be used for the sockets 14 for semiconductor devices having various sizes. For example, the sockets 14 have large sizes for semiconductor devices having large sizes. In this case, the adapter 29 is mounted on the tester calibration device 2 (base board 21) having a smaller size so that the tester calibration devices 2 can be used for the sockets 14 having large sizes.

The adapter 29 of the present embodiment is applicable to the first and second embodiments.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A tester calibration device comprising:
a first board to be installed on one of a plurality of sockets of a tester for testing a semiconductor device, when the tester is to be calibrated;
a plurality of first pins provided on a first face of the first board, and configured to contact with the one socket when the tester is to be calibrated; and
a wiring configured to electrically connect some of the plurality of first pins with each other,
wherein a second board, which includes N first openings through which N first pins among the plurality of first pins are to be exposed, is attachable to the first face of the first board through the plurality of first pins, where N is an integer of one or more, and
the N first pins are configured to contact with the one socket through the N first openings.

2. The device of claim 1, wherein the first board is provided as an individual separated piece for each socket.

3. The device of claim 1, further comprising a plurality of second pins provided on a second face of the first board, and configured to contact with the one socket when the tester is to be calibrated.

4. The device of claim 3, wherein a number or arrangement of the plurality of second pins is different from a number or arrangement of the plurality of first pins.

5. The device of claim 3, further comprising a wiring configured to electrically connect some of the plurality of second pins with each other.

6. The device of claim 3, wherein
a third board, which includes M second openings through which M second pins among the plurality of second pins are to be exposed, is attachable to the second face of the first board through the plurality of second pins, where M is an integer of one or more, and
the M second pins are configured to contact with the one socket through the M second openings.

7. The device of claim 1, wherein an outer frame, which encloses end faces of the first board in a ring shape, is attachable to the first board.

8. A tester calibration method comprising:
preparing a tester calibration device that includes a first board to be installed on one of a plurality of sockets of a tester for testing a semiconductor device when the tester is to be calibrated, and a plurality of first pins provided on a first face of the first board and configured to contact with the one socket when the tester is to be calibrated; and
calibrating the tester by making the plurality of first pins contact with the one socket,
wherein a second board, which includes N first openings through which N first pins among the plurality of first pins are to be exposed, is attachable to the first face of the first board through the plurality of first pins, where N is an integer of one or more, and
the N first pins are configured to contact with the one socket through the N first openings.

9. The method of claim 8, wherein the tester calibration device further includes a wiring configured to electrically connect some of the plurality of first pins with each other.

10. The method of claim 8, wherein the first board is provided as an individual separated piece for each socket.

11. The method of claim 8, wherein the tester calibration device further includes a plurality of second pins provided on a second face of the first board, and configured to contact with the one socket when the tester is to be calibrated.

12. The method of claim 11, wherein a number or arrangement of the plurality of second pins is different from a number or arrangement of the plurality of first pins.

13. The method of claim 11, wherein the tester calibration device further includes a wiring configured to electrically connect some of the plurality of second pins.

14. The method of claim 11, wherein
a third board, which includes M second openings through which M second pins among the plurality of second pins are to be exposed, is attachable to the second face of the first board through the plurality of second pins, where M is an integer of one or more, and
the M second pins are configured to contact with the one socket through the M second openings.

15. The method of claim 8, wherein an outer frame, which encloses end faces of the first board in a ring shape, is attachable to the first board.

16. The method of claim 8, wherein the tester is calibrated such that K tester calibration devices are installed on K sockets of the tester, where K is an integer of two or more.

17. The method of claim 8, wherein
the tester includes a driver configured to transmit the signal to the semiconductor device, and a comparator configured to receive the signal from the semiconductor device, and
the tester is calibrated by transmitting a signal to the tester calibration device by the driver and receiving a signal from the tester calibration device by the comparator.

18. The method of claim 17, wherein the tester adjusts the driver and the comparator based on the signal transmitted to the tester calibration device by the driver and the signal received from the tester calibration device by the comparator.

\* \* \* \* \*